(12) United States Patent
Sanga (10) Patent No.: US 12,317,663 B2
(45) Date of Patent: May 27, 2025

(54) METHOD OF MANUFACTURING LIGHT EMITTING DEVICE AND LIGHT EMITTING DEVICE

(71) Applicant: NICHIA CORPORATION, Anan (JP)

(72) Inventor: Daisuke Sanga, Tokushima (JP)

(73) Assignee: NICHIA CORPORATION, Anan (JP)

( * ) Notice: Subject to any disclaimer, the term of this patent is extended or adjusted under 35 U.S.C. 154(b) by 441 days.

(21) Appl. No.: 17/846,793

(22) Filed: Jun. 22, 2022

(65) Prior Publication Data
US 2022/0384698 A1 Dec. 1, 2022

Related U.S. Application Data

(63) Continuation of application No. PCT/JP2020/048278, filed on Dec. 23, 2020.

(30) Foreign Application Priority Data

Dec. 24, 2019 (JP) .................... 2019-233329

(51) Int. Cl.
*H10H 20/857* (2025.01)
*H01L 25/075* (2006.01)
*H10H 20/01* (2025.01)

(52) U.S. Cl.
CPC ....... *H10H 20/857* (2025.01); *H01L 25/0753* (2013.01); *H10H 20/0364* (2025.01)

(58) Field of Classification Search
CPC ....... H01L 25/0753; H01L 2224/16225; H01L 2224/81; H01L 2224/95; H10H 20/0364; H10H 20/01; H10H 20/857
See application file for complete search history.

(56) References Cited

U.S. PATENT DOCUMENTS 10,359,181 B2 * 7/2019 Konishi ................ F21V 23/06
2011/0266039 A1 11/2011 Tomoda
(Continued)

FOREIGN PATENT DOCUMENTS

DE 10 2008 039 790 A1 3/2010
JP H07-183304 A 7/1995
(Continued)

OTHER PUBLICATIONS

International Search Report mailed Mar. 23, 2021 corresponding International Application No. PCT/JP2020/048278; 2 pages.

*Primary Examiner* — Victor A Mandala
(74) *Attorney, Agent, or Firm* — Foley & Lardner LLP (57) ABSTRACT

A method of manufacturing a light emitting device includes: providing a light emitting element including a p-side electrode and a n-side electrode on a same surface side; providing a substrate on which first and second wiring seed layers are formed; forming a resist pattern within an area on the substrate where the light emitting element is to be placed; placing the light emitting element on the resist pattern such that the p-side electrode and the first wiring seed layer are separated from and face each other, and the n-side electrode and the second wiring seed layer are separated from and face each other; joining the first wiring seed layer with the p-side electrode, and joining the second wiring seed layer with the n-side electrode, by plating using the resist pattern as a mask; and removing the resist pattern.

12 Claims, 7 Drawing Sheets

(56) References Cited

U.S. PATENT DOCUMENTS

| | | | |
|---|---|---|---|
| 2012/0169786 A1* | 7/2012 | Okuyama | H10H 20/853 |
| | | | 362/249.02 |
| 2014/0008691 A1* | 1/2014 | Tomoda | H10F 77/933 |
| | | | 257/435 |
| 2014/0284634 A1* | 9/2014 | Hirao | H01L 24/24 |
| | | | 438/22 |
| 2015/0221842 A1* | 8/2015 | Mima | H10H 20/852 |
| | | | 438/26 |
| 2016/0172347 A1 | 6/2016 | Tomoda et al. | |
| 2017/0117262 A1 | 4/2017 | Suzuki | |
| 2017/0328545 A1* | 11/2017 | Konishi | F21V 7/10 |
| 2019/0006564 A1 | 1/2019 | Sasaki et al. | |
| 2019/0181315 A1 | 6/2019 | Liao et al. | |
| 2020/0302835 A1* | 9/2020 | Ohmae | H10H 20/857 |

FOREIGN PATENT DOCUMENTS

| | | |
|---|---|---|
| JP | H08-148531 A | 6/1996 |
| JP | 2009-071199 A | 4/2009 |
| JP | 2010-232615 A | 10/2010 |
| JP | 2011-003626 A | 1/2011 |
| JP | 2011-233733 A | 11/2011 |
| JP | 2012-142489 A | 7/2012 |
| JP | 2014-013818 A | 1/2014 |
| JP | 2014-209580 A | 11/2014 |
| JP | 2015-184600 A | 10/2015 |
| JP | 2017-183458 A | 10/2017 |

\* cited by examiner

METHOD OF MANUFACTURING LIGHT EMITTING DEVICE AND LIGHT EMITTING DEVICE

CROSS-REFERENCE TO RELATED APPLICATIONS

This is a bypass continuation of PCT Application No. PCT/JP2020/048278, filed on Jun. 24, 2022, which claims priority to Japanese Application No. 2019-233329, filed on Dec. 24, 2019. The contents of these applications are hereby incorporated by reference in their entirety.

BACKGROUND

An embodiment of the present invention relates to a method of manufacturing a light emitting device, and a light emitting device.

There is a conventionally known method of mounting electronic components such as a light emitting element above a wiring substrate. For example, first, an uncured or semi-cured adhesive material is applied onto the surface of a wiring substrate, and the main surface of the wiring substrate on a side opposite to the side where the light emitting element is disposed is then irradiated with light to thereby cure a predetermined portion of the applied adhesive material via the wiring substrate, so that the light emitting element is attached and supported thereon. Thereafter, the uncured or semi-cured adhesive material located in portions other than the predetermined portion of the adhesive material is removed, and in the removed parts, electrodes provided on the light emitting element are connected to wiring on the wiring substrate by a plating method. As discussed above, electronic components including the light emitting element can be mounted above the wiring substrate (see JP 2017-183458 A).

SUMMARY

In recent years, the demand for high thermal conductivity of substrates and high integration of drive circuits, especially wirings, has been increasing. A non-transparent substrate, such as a Si substrate, is expected as the substrate that meets these requirements. However, when using such a non-transparent substrate, irradiated light is not allowed to pass therethrough in the same way as in the related art, and as a result, the light emitting element cannot be suitably mounted above a wiring substrate.

An object of certain embodiments of the present invention is to provide a method of manufacturing a light emitting device that can suitably mount a light emitting element above a wiring substrate, regardless of whether the wiring substrate is a transparent substrate or a non-transparent substrate, and to provide a light emitting device obtained by the manufacturing method.

According to an embodiment of the present invention, a method of manufacturing a light emitting device includes:
  providing a light emitting element comprising a p-side electrode and a n-side electrode on a same surface side;
  providing a substrate on which a first wiring seed layer and a second wiring seed layer are formed with a predetermined spacing therebetween;
  forming a resist pattern, at least a part of which is within an area on the substrate where the light emitting element is to be placed;
  subsequently, placing the light emitting element on the resist pattern such that the p-side electrode and the first wiring seed layer are separated from and face each other, and the n-side electrode and the second wiring seed layer are separated from and face each other;
  subsequently, joining the first wiring seed layer with the p-side electrode disposed separately from the first wiring seed layer, and joining the second wiring seed layer with the n-side electrode disposed separately from the second wiring seed layer, by plating using the resist pattern as a mask; and
  subsequently, removing the resist pattern.

According to another embodiment of the present invention, a light emitting device includes:
  a wiring substrate including:
    a substrate, and
    a first wiring and a second wiring disposed on the substrate;
  a light emitting element located above the wiring substrate and including a first electrode and a second electrode;
  a first conductive member connecting the first wiring and the first electrode; and
  a second conductive member connecting the second wiring and the second electrode,
  wherein an outer lateral surface of the first conductive member protrudes outward from a straight line that connects an outer end of the first wiring and an outer end of the first electrode in a cross-sectional view.

According to certain embodiments of the present invention, a light emitting element can be suitably mounted on the wiring substrate regardless of whether the wiring substrate is a transparent substrate or a non-transparent substrate.

DETAILED DESCRIPTION

[Manufacturing Method of Light Emitting Device]

Hereinafter, a method of manufacturing a light emitting device according to an embodiment of the present invention will be described in detail with reference to the accompanying drawings. As used herein, terms indicative of the specific direction or position may be used as necessary. However, the use of these terms is to make the understanding of the present invention easier with reference to the drawings, and the technical scope of the present invention is not limited by the meaning of these terms. Parts with the same reference characters appearing in multiple drawings refer to the same or equivalent parts.

Further, the following embodiments are only examples of a method of manufacturing a light emitting device in order embodying the technical ideas of the present invention, and do not limit the present invention. The dimensions, materials, shapes, relative arrangements, etc., of the components discussed below are intended to be illustrative, not limiting the scope of the present invention thereto unless otherwise specifically stated. The size, positional relationship, etc., of members shown in the drawings may be exaggerated for clarity of explanation.

First Embodiment

Hereinafter, a method of manufacturing a light emitting device according to a first embodiment of the present invention will be described with reference to the accompanying drawings.

In the first embodiment, the light emitting device is manufactured by mounting a single light emitting element above a wiring substrate, with a p-side electrode which can be referred to as a first electrode herein and an n-side electrode which can be referred to as a second electrode herein included in the light emitting element on the same surface side by way of example.

In such an embodiment, the manufacturing method according to the first embodiment of the present invention includes the following steps (a) to (e).

(a) Formation Step of Wiring Seed Layer on Substrate

Figure 1A:
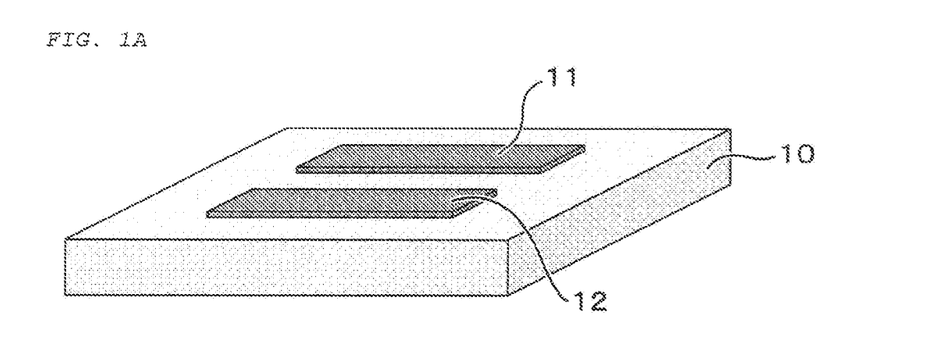
FIG. 1A is a perspective view schematically showing an embodiment of forming a wiring seed layer on a substrate.

FIG. 1A is a perspective view schematically showing an embodiment of forming a wiring seed layer on a substrate.

As shown in FIG. 1A, a wiring seed layer 11 on the positive electrode side, which can be referred to as a first wiring seed layer herein and a wiring seed layer 12 on the negative electrode side, which can be referred to as a second wiring seed layer herein are formed on a substrate 10 with a predetermined spacing therebetween. A substrate 10 that is provided with a wiring seed layer 11 on the positive electrode side and a wiring seed layer 12 on the negative electrode with a predetermined spacing therebetween may be prepared.

The predetermined spacing between the wiring seed layers 11 and 12 is preferably one that enables a p-side electrode of a light emitting element 30, which is to be placed later, to face the wiring seed layer 11 on the positive electrode side, while enabling an n-side electrode thereof to face the wiring seed layer 12 on the negative electrode side. For example, when the size of the light emitting element is 50 μm×50 μm in the plan view, the spacing between the wiring seed layers 11 and 12 can be 14 μm.

As the substrate 10, not only a transparent substrate, but also a non-transparent substrate can be used. Examples of the material for the transparent substrate include glass, quartz, sapphire, ceramics (for example, transparent alumina), and organic films (for example, PET). Examples of the material for the non-transparent substrate include semiconductors (for example, Si, Ge, GaAs, InP), ceramics (for example, alumina, AlN), metals (for example, Al, Cu), and organic materials (for example, FR4).

(b) Formation Step of Resist Pattern

Figure 1B:
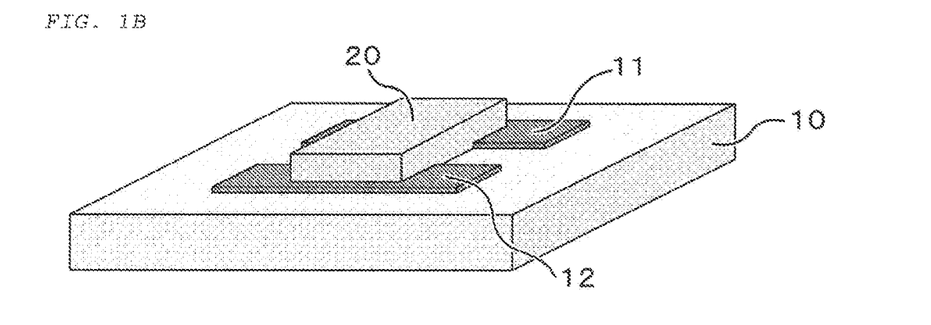
FIG. 1B is a perspective view schematically showing an embodiment of forming a resist pattern.

FIG. 1B is a perspective view schematically showing an embodiment of forming a resist pattern.

At least a part of a resist pattern 20 is formed within an area on the substrate 10 where the light emitting element 30 is to be placed. It is noted that the term "resist pattern" as used herein refers to a resist with a pattern that exposes a part of the substrate so that a plating growth area can be secured later within the area on the substrate 10 where the light emitting element 30 is to be placed. The "resist pattern" can also be referred to as a "patterned resist" or "patterning resist." The resist pattern 20 may be formed within the area on the substrate 10 where the light emitting element 30 is to be placed as shown in FIG. 1B. Alternatively, a part of the resist pattern 20 may protrude outward from the area where the light emitting element 30 is to be placed.

Hereinafter, a description will be given on a case in which the whole resist pattern 20 is disposed within the area where the light emitting element 30 is to be placed later, by way of example.

Specifically, the resist pattern 20 having a planar size smaller than that of the light emitting element 30 is formed within the area where the light emitting element 30 is to be placed such that the electrodes (p-side electrode and n-side electrode) of the light emitting element 30 and the respective wiring seed layers 11 and 12 can face each other while being separated from each other with a spacing therebetween when placing the light emitting element 30 later. That is, in the plan view, the resist pattern 20 is disposed such that the electrodes (p-side electrode and n-side electrode) of the light emitting element 30 overlap the wiring seed layers 11 and 12, respectively, in an area where the resist pattern 20 is not disposed. This can suitably secure a space between the electrodes of the light emitting element 30 and the respective wiring seed layers 11 and 12 (specifically, a narrow space for growing plating later). The planar size of the resist pattern 20 can be set to 20% or more and 40% or less of the planar size of the light emitting element 30.

The resist pattern 20 may be formed within the area where the light emitting element 30 is to be placed later and at least between the wiring seed layer 11 on the positive electrode side and the wiring seed layer 12 on the negative electrode side, in the plan view.

As a formation method of the resist pattern 20, a photolithography method or a screen printing method can be used. By using the photolithography method, a fine resist pattern can be formed.

It is preferable that the resist of the resist pattern 20 has an adhesive property. Because of the adhesive property of the resist, the light emitting element 30, which is to be placed later, can be attached to and supported by the resist pattern 20.

The resist pattern 20 preferably has the above adhesive property and also chemical resistance to a plating solution to be used later. As the resist pattern 20, for example, a phenol resin, an epoxy-based resin, a silicone-based resin, or an acrylic resin can be used. The use of the resist pattern 20 eliminates the need to provide members for the respective purposes of attaching and supporting a light emitting element and serving as a mask in plating joint, which can decrease the number of manufacturing steps. In addition, the manufacturing steps can be implemented easily because they are not subjected to restrictions (solubility in one solvent, different appropriate process temperatures, or the like) due to a combination of forming conditions that would be otherwise required if used in combination with other different members.

The cross-sectional shape of the resist pattern 20 can be rectangular or square. In other words, the contact surface (top surface) of the resist pattern 20 in contact with the light emitting element 30 and the lateral surface of the resist pattern 20 can be in a substantially vertical relationship. This can precisely secure the contact area between the light emitting element 30 and the resist pattern 20 as well as the plating growth area that connects the wiring seed layer and the electrode of the light emitting element later.

The cross-sectional shape of the resist pattern 20 may be a tapered one. The resist pattern can have a shape that becomes wider in width from the substrate 10 toward the light emitting element 30, or a shape that becomes narrower in width from the substrate 10 toward the light emitting element 30. As the resist pattern is shaped to have its width wider from the substrate 10 toward the light emitting element 30, the area where the light emitting element 30 is in contact with the resist pattern 20 can increase, ensuring that the light emitting element and the resist pattern can be attached to each other.

In the cross-sectional view, the height of the resist pattern 20 is preferably higher than the height of each of the wiring seed layer 11 on the positive electrode side and the wiring seed layer 12 on the negative electrode side. Thus, due to the difference in the height, when the light emitting element 30 is placed on the resist pattern 20 later, the wiring seed layer provided on the substrate 10 and the electrode of the light emitting element 30 placed on the resist pattern 20 can be separated from each other with the resist pattern 20 interposed therebetween.

Such separation can secure a space for connecting the wiring seed layer and the electrode of the light emitting element 30 by plating during a plating process later. Electrolytic plating or electroless plating can be used as the plating process.

The "height of the resist pattern 20" as used herein refers to the thickness of the resist pattern 20. The height of the resist can be set to 1 µm or more and 3 µm or less. The height of the resist pattern 20 is preferably smaller than the interval between the wiring seed layers 11 and 12. If the height of the resist pattern 20 is greater than the interval between the wiring seed layers 11 and 12, the wiring seed layer 11 and the wiring seed layer 12 may be connected by plating before the wiring seed layer and the corresponding electrode of the light emitting element are connected by plating during a plating process. However, when the height of the resist pattern 20 is smaller than the interval between the wiring seed layers 11 and 12, the wiring seed layer 11 and the wiring seed layer 12 can be prevented from being connected together by plating.

(c) Placing Step of Light Emitting Element

Figure 1C:
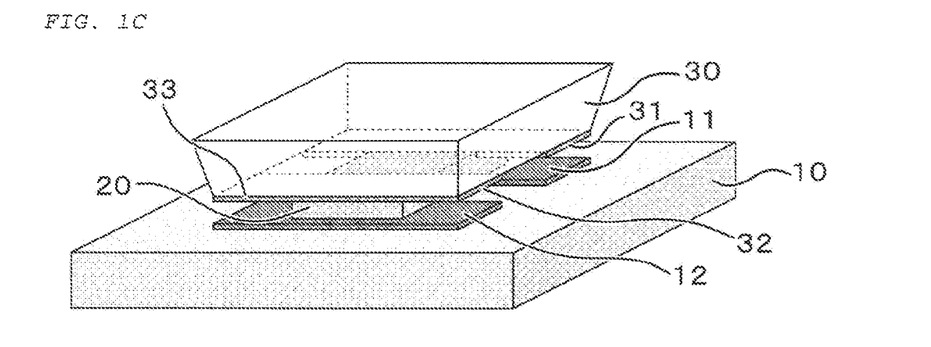
FIG. 1C is a perspective view schematically showing an embodiment of placing a light emitting element.

FIG. 1C is a perspective view schematically showing an embodiment of placing the light emitting element.

As shown in FIG. 1C, the light emitting element 30 is placed on the resist pattern 20.

In both the (a) step and the (b) step, the light emitting element 30 and the wiring seed layers 11 and 12 are adjusted in advance so that the respective electrodes of the light emitting element 30, which is to be placed later, can face the wiring seed layers 11 and 12. Thus, in the (c) step, the p-side electrode 31 of the light emitting element 30 and the wiring seed layer 11 on the positive electrode side can be separated from and face each other, while the n-side electrode 32 of the light emitting element 30 and the wiring seed layer 12 on the negative electrode side can be separated from and face each other, when the light emitting element 30 is placed on the resist pattern 20. This can suitably secure a narrow space for growing plating P between the electrodes 31 and 32 of the light emitting element 30 and the wiring seed layers 11 and 12, respectively.

Furthermore, the light emitting element 30 can be surely placed on the resist pattern 20. The "electrode of the light emitting element 30 and the wiring seed layer face" as used herein refers to a relationship in which a part of the electrode of the light emitting element 30 faces a part of the wiring seed layer in the cross-sectional view.

When placing the light emitting element 30 on the resist pattern 20, it may be placed while being subjected to thermocompression if the material of the resist pattern 20 is thermoplastic. Thus, the light emitting element 30 can be attached and supported onto the resist pattern 20, thereby making it possible to ensure adhesion between the light emitting element 30 and the resist pattern 20. The cross-sectional shape of the resist pattern may be a barrel shape (an outward expanding shape) when the resist pattern is pressurized by thermocompression or the like.

Figure 1D:
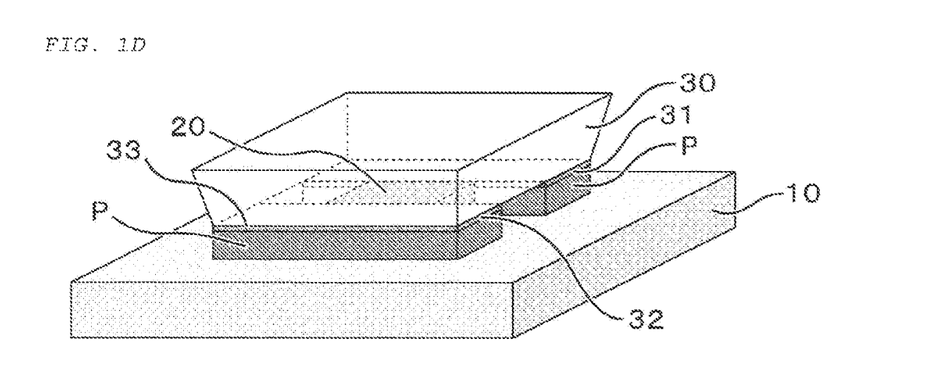
FIG. 1D is a perspective view schematically showing an embodiment of joining wiring seed layers with electrodes of the light emitting element, respectively by plating.

(d) Joining Step of Wiring Seed Layers with Electrodes of Light Emitting Element, Respectively by Plating FIG. 1D is a perspective view schematically showing an embodiment of joining the wiring seed layers with the electrodes of the light emitting element, respectively by plating.

As shown in FIG. 1D, by using the resist pattern 20 as a mask, the wiring seed layer 11 on the positive electrode side is joined by plating to the p-side electrode 31 disposed separately from the wiring seed layer 11 on the positive electrode side, while the wiring seed layer 12 on the negative electrode side is joined by plating to the n-side electrode 32 disposed separately from the wiring seed layer 12 on the negative electrode side. As a result, the wiring seed layer 11 on the positive electrode side is electrically connected to the p-side electrode 31, while the wiring seed layer 12 on the negative electrode side is electrically connected to the n-side electrode 32.

In the (d) step, the plating process is performed using the resist pattern 20 as the mask while the narrow space is suitably secured.

Electrolytic plating or electroless plating can be used as the plating process. Copper (Cu) can be used as a plating solution. When the plating solution of copper is used, the electrode of the light emitting element and the wiring seed layer are connected with copper, so that the electrode of the light emitting element and the wiring seed layer can be joined together by the plating. It is noted that in addition to copper, gold (Au), zinc (Zn), chromium (Cr), and/or nickel (Ni), etc., can be used for the plating solution.

(e) Removal Step of Resist Pattern

Figure 1E:
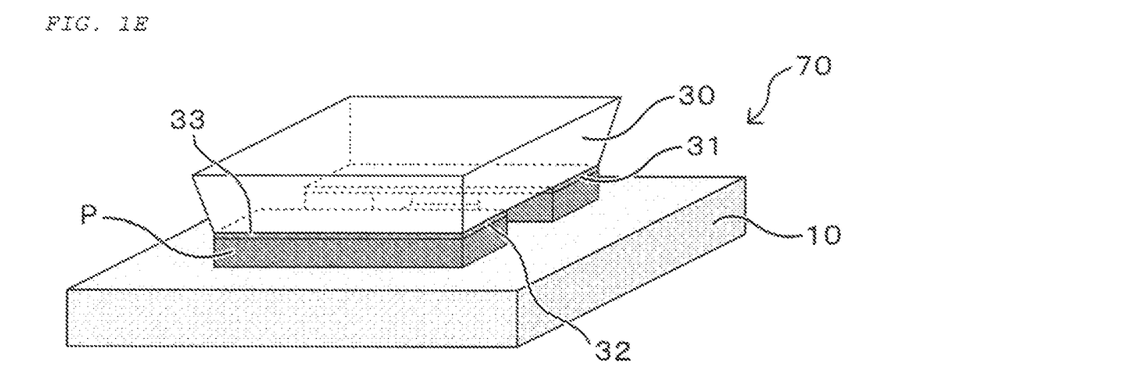
FIG. 1E is a perspective view schematically showing an embodiment of removing the resist pattern.

FIG. 1E is a perspective view schematically showing an embodiment of removing the resist pattern.

As shown in FIG. 1E, the resist pattern 20 is removed.

The removal of the resist pattern 20 can be performed by immersing it in a peeling solution that can peel off the resist, or by other methods. For example, after the joining between the wiring seed layer 11, 12 and the electrode 31, 32 via the plating is completed, any resist peeling solution is applied to the resist pattern 20 using a nozzle within a chamber. Such a resist peeling solution allows the resist pattern 20 to be dissolved therein, causing the dissolved resist pattern 20 to be fed to the outside of the substrate 10 using predetermined gas or the like.

The resist peeling solution may be a mixed solution containing sulfuric acid, an organic solvent, and the like. An organic solvent suitable for use is, for example, at least one kind of solvent selected from the group of alcohol solvents such as 2-propanol, ketone solvents such as acetone, ester solvents such as ethyl acetate, and ether solvents. Examples of the gas used to feed out the dissolved resist pattern 20 include argon gas, nitrogen gas, and the like.

As discussed above, the light emitting element 30 is mounted on the substrate 10, thereby making it possible to manufacture a light emitting device 70 according to the first embodiment.

In consideration of the (a) to (e) steps discussed above, the method of manufacturing a light emitting device according to the first embodiment does not need the step of irradiating, with light, the main surface side of the substrate opposite to the side where the light emitting element is disposed to cure the adhesive material for bonding the light emitting element to the substrate in the conventional manufacturing method. Thus, with the manufacturing method, the light emitting element can be suitably mounted on the substrate 10, regardless of whether the substrate 10 is a transparent substrate or a non-transparent substrate.

Second Embodiment

Hereinafter, a method of manufacturing a light emitting device according to a second embodiment of the present invention will be described with reference to the accompanying drawings.

As discussed above, the first embodiment is an embodiment in which the light emitting device is manufactured by mounting the single light emitting element above the single wiring substrate. In contrast, the second embodiment is an applied example of the first embodiment and is an embodiment in which a light emitting device is manufactured by mounting at least two light emitting elements above the single wiring substrate. Because the second embodiment is the applied example of the first embodiment, a description regarding parts that overlap the contents of the first embodiment will be omitted.

In the method of manufacturing a light emitting device according to the second embodiment of the present invention, at least two light emitting elements, each having both of a p-side electrode and an n-side electrode on the same surface side, are placed above a substrate. In such an embodiment, the manufacturing method according to the second embodiment of the present invention includes the following steps.

(A) Formation Step of Wiring Seed Layer on Substrate

Figure 2A:
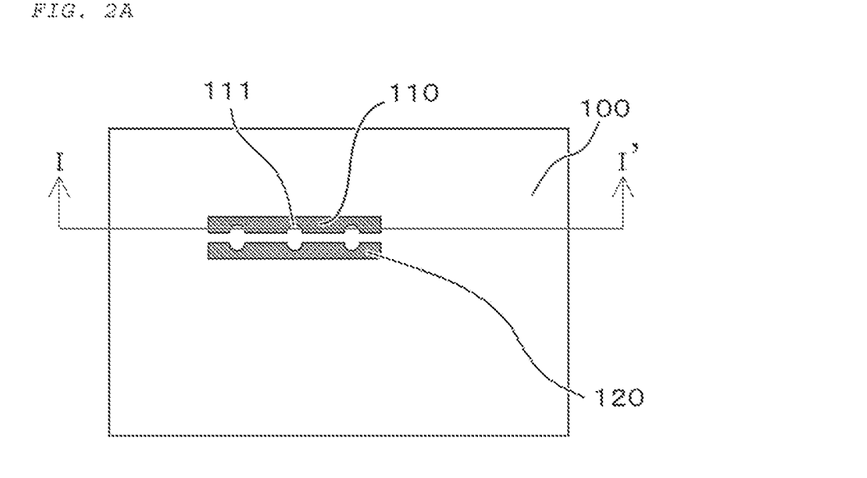
FIG. 2A is a plan view schematically showing an embodiment of forming a wiring seed layer on a substrate.
Figure 2B:
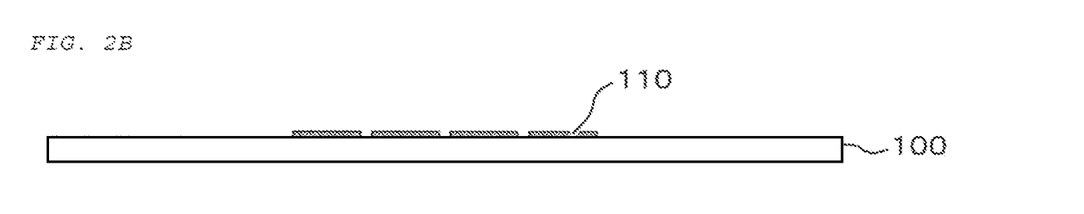
FIG. 2B is a cross-sectional view taken along the line I-I' of FIG. 2A, schematically showing an embodiment of forming the wiring seed layer on the substrate.

FIG. 2A is a plan view schematically showing an embodiment of forming wiring seed layers on a substrate. FIG. 2B is a cross-sectional view taken along the line I-I' of FIG. 2A, schematically showing an embodiment of forming the wiring seed layers on the substrate.

As shown in FIGS. 2A and 2B, a wiring seed layer 110 on the positive electrode side and a wiring seed layer 120 on the negative electrode side are formed on the substrate 100 with a predetermined spacing therebetween. A substrate 100 that is provided with the wiring seed layer 110 on the positive electrode side and the wiring seed layer 120 on the negative electrode side with a predetermined spacing therebetween may be prepared.

Specifically, from the viewpoint of disposing at least two light emitting elements with a predetermined spacing therebetween on top of the respective wiring seed layers 110 and 120 later, the wiring seed layers 110 and 120 are formed on the substrate 100 such that the wiring seed layer 110 on the positive electrode side and the wiring seed layer 120 on the negative electrode side extend substantially in the same direction. The "wiring seed layer 110 on the positive electrode side and the wiring seed layer 120 on the negative electrode side extend substantially in the same direction" as used herein corresponds to a case where both wiring seed layers extend in the completely same direction (in parallel), but includes a case where an angle formed between both wiring seed layers is within ±1 degree.

As shown in FIG. 2A, the wiring seed layer 110 on the positive electrode side and the wiring seed layer 120 on the negative electrode side may include concave portions 111 in the plan view. The concave portions 111 provided in the wiring seed layer 110 on the positive electrode side are provided on the side of the wiring seed layer 110 on the positive electrode side that faces the wiring seed layer 120 on the negative electrode side. The concave portions 111 provided in the wiring seed layer 120 on the negative electrode side are provided on the side of the wiring seed layer 120 on the negative electrode side that faces the wiring seed layer 110 on the positive electrode side.

The concave portions 111 can be provided within respective areas where the light emitting elements are to be placed. The concave portions 111 can be formed to allow a first resist pattern 210 to be inserted into the corresponding concave portion 111 of the wiring seed layer 120 in the plan view. That is, the concave portions 111 can be formed in positions where they are covered with the first resist patterns 210. The shape of the concave portion 111 is a semicircle in FIG. 2A, but it can be any other shape (such as a rectangle). The concave portion 111 may be formed on only one of the wiring seed layer 110 on the positive electrode side and the wiring seed layer 120 on the negative electrode side.

Because the concave portions 111 are formed in positions where they are covered with the first resist patterns 210, the area of the first resist pattern 210 in contact with the wiring seed layer decreases, and the area thereof in contact with the substrate 100 increases, thereby making it possible to improve the adhesion between the resist pattern and the substrate 100.

(B) Formation Step of Resist Pattern

Figure 2C:
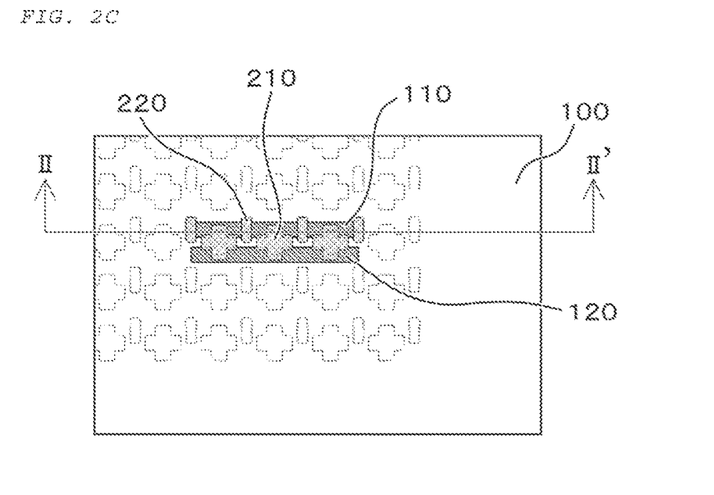
FIG. 2C is a plan view schematically showing an embodiment of forming a resist pattern.
Figure 2D:
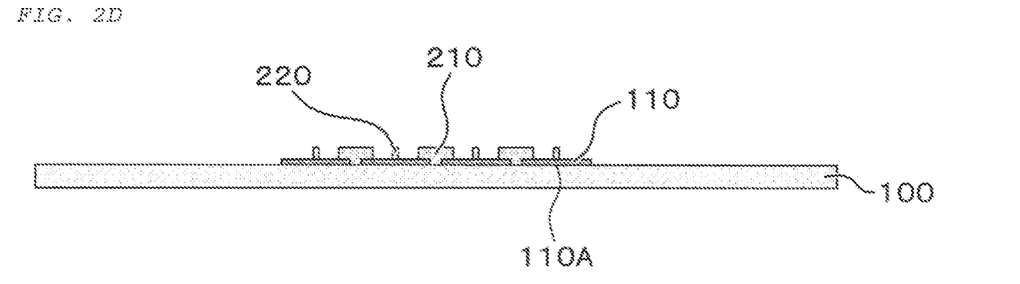
FIG. 2D is a cross-sectional view taken along the line II-II' of FIG. 2C, schematically showing the embodiment of forming the resist pattern.

FIG. 2C is a plan view schematically showing an embodiment of forming the resist pattern. FIG. 2D is a cross-sectional view taken along the line II-II' of FIG. 2C, schematically showing the embodiment of forming the resist pattern.

As shown in FIGS. 2C and 2D, the first resist patterns 210 are respectively formed within respective areas on the substrate 100 where at least two light emitting elements 300 are placed with a predetermined spacing therebetween. The first resist pattern 210 corresponds to the resist pattern 20 of the first embodiment.

Specifically, each of the first resist patterns 210 having a planar size smaller than that of the light emitting element 300 is formed within the area where the corresponding light emitting element 300 is to be placed such that the electrodes of each light emitting element 300 and the respective wiring seed layers 110 and 120 can be separated from and face each other when placing at least two light emitting elements 300 later with a predetermined spacing therebetween.

By forming the respective first resist patterns 210 discussed above, a space (specifically, a narrow space for growing plating later) can be secured between the electrode of each light emitting element 300, which is to be placed on the first resist pattern 210 later, and a corresponding one of the wiring seed layers 110 and 120.

The planar shape of the first resist pattern 210 is preferably a cruciform shape as shown in FIG. 2C. This is because the light emitting element 300 can be placed stably on the first resist pattern 210 while securing a flow path for the plating solution in joining by plating. The first resist pattern 210 can adopt any other planar shapes, such as a square shape, a rectangular shape, and a triangular shape, for example.

The first resist pattern 210 may contact electrodes 310 and 320 of the light emitting element or may not contact the electrodes 310 and 320 of the light emitting element. When the first resist pattern 210 contacts the electrodes 310 and 320 of the light emitting element, a large contact area of the light emitting element 300 with the first resist pattern can be created while securing a predetermined, necessary and sufficient plating joint area. This can enhance the adhesion force between the light emitting element 300 and the first resist pattern 210.

In a case where there is a recess on the surface of the electrode 310 or 320 of the light emitting element, plating growth may occur in the recess portion, and thus a plating solution may remain in the recess after the end of the joining by plating. For this reason, plating may be desirably avoided from growing in the recess provided on the surface of the electrode 310 or 320 of the light emitting element. In this case, it is preferable that the tip of the resist pattern with the cruciform shape in the plan view, which contacts the electrode surface of the light emitting element, covers the recess present on the electrode surface of the light emitting element.

In contrast, when the first resist pattern 210 does not contact the electrodes 310 and 320 of the light emitting element, plating growth occurs over the entire area of the electrode to form a thick film. When flash etching is used to cut a thin film in a local part of the wiring seed layer 110, the plating growth area is also etched by the thickness of the local part. However, because the plating growth area is thickened by the thick film, the conductivity of the plating growth area can be secured.

The first resist pattern 210 preferably has an adhesive property, like the first embodiment. The first resist pattern 210 is formed by using material with a higher adhesive property than a resin material 400 formed on a carrier substrate 500 to be discussed below, so that the carrier substrate 500 can be peeled off from the light emitting element while preventing the light emitting element from being peeled off from the first resist pattern when the light emitting element mounted on the carrier substrate 500 is transferred to the substrate 10.

The height of the first resist pattern 210 is preferably 10 to 30 times as great as the thickness of the wiring seed layer 110. When the flash etching is used to cut a local part 110A of the wiring seed layer 110 to be discussed below, a plating growth area for connecting the electrode and the wiring seed layer is also etched. However, because the first resist pattern 210 has a predetermined height or higher, the plating growth area is thickened in the horizontal direction as well, so that favorable electrical connectivity between the electrode and the wiring seed layer can be maintained even if the plating growth area is etched by the flash etching.

In the (B) step, in addition to the formation of the first resist pattern 210, a second resist pattern 220 is formed on the wiring seed layer 110 on the positive electrode side or on the wiring seed layer 120 on the negative electrode side.

The second resist pattern 220 may be formed in a part between one light emitting element 300 and the other light emitting element 300 that are adjacent to each other, and on the wiring seed layer 110 on the positive electrode side or on the wiring seed layer 120 on the negative electrode side. That is, the location of the part between one light emitting element 300 and the other light emitting element 300 that are adjacent to each other may be recognized in advance, and then the second resist pattern 220 may be formed there.

In the following, a description will be given on an embodiment in which the second resist pattern 220 is formed on the wiring seed layer 110 on the positive electrode side as shown in FIG. 2C. The presence of the second resist pattern 220 can inhibit the plating growth on the wiring seed layer 110 at a formation portion of the second resist pattern 220 in a subsequent plating process.

Because the wiring seed layer 110 maintains its thickness before the plating (thin thickness) at the formation portion of the second resist pattern 220, the wiring seed layer at the formation portion of the second resist pattern 220 is removed by the flash etching to be discussed below, so that the wiring seed layer 110 can be cut into pieces that are electrically disconnected.

From the viewpoint of cutting the wiring seed layer 110 more surely, the second resist pattern 220 is preferably formed continuously from one end to the other end of the wiring seed layer 110 in a direction perpendicular to an extending direction of the wiring seed layer 110 in the plan view.

The second resist pattern 220 may be formed at the same time as the first resist pattern 210, or may be formed separately from the first resist pattern 210. By forming the second resist pattern 220 together with the first resist pattern 210 at the same time, the number of steps can be decreased.

(C) Placing Step of Light Emitting Elements

Figure 2E:
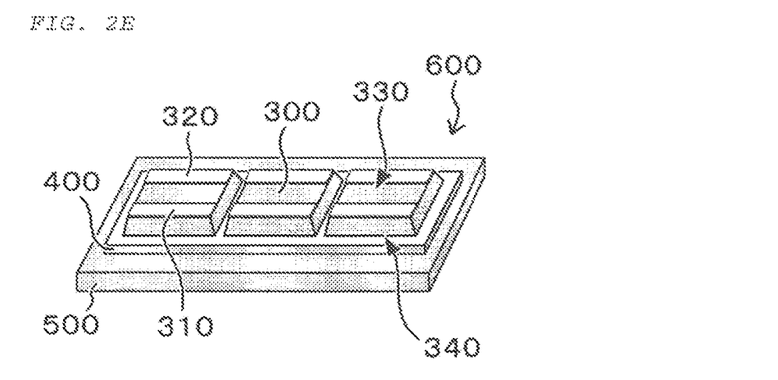
FIG. 2E is a perspective view schematically showing a light emitting element-mounted carrier substrate, which is a carrier substrate on which a light emitting element is mounted.
Figure 2F:
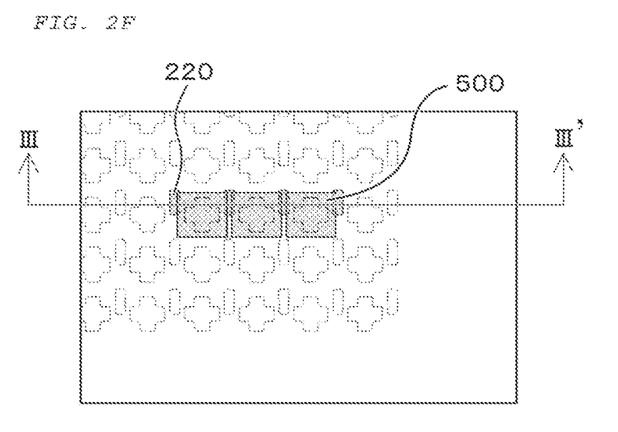
FIG. 2F is a plan view schematically showing an embodiment of placing the light emitting element-mounted carrier substrate on a first resist pattern.
Figure 2G:
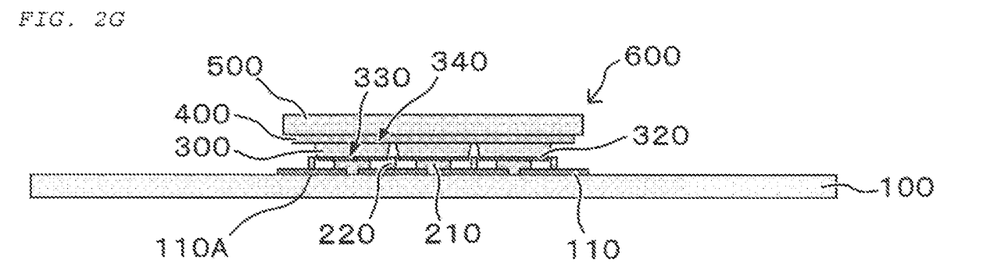
FIG. 2G is a cross-sectional view taken along the line III-III' of FIG. 2F, schematically showing the embodiment of placing the light emitting element-mounted carrier substrate on the first resist pattern.

FIG. 2E is a perspective view schematically showing a light emitting element-mounted carrier substrate, which is a carrier substrate with a light emitting element mounted thereon. FIG. 2F is a plan view schematically showing an embodiment of placing the light emitting element-mounted carrier substrate on a first resist pattern. FIG. 2G is a cross-sectional view taken along the line III-III' of FIG. 2F, schematically showing the embodiment of placing the light emitting element-mounted carrier substrate on the first resist pattern.

As shown in FIGS. 2E to 2G, the light emitting elements 300 are placed on the respective first resist patterns 210. Specifically, a light emitting element-mounted carrier substrate 600 is placed on at least two of the first resist patterns 210 formed with a spacing therebetween such that an electrode surface 330 of the light emitting element 300 faces the corresponding first resist pattern 210. At this time, a p-side electrode 310 of the light emitting element 300 and the wiring seed layer 110 on the positive electrode side are separated from and face each other, while an n-side electrode 320 of the light emitting element 300 and the wiring seed layer 120 on the negative electrode side are separated from and face each other.

The above light emitting element-mounted carrier substrate 600 will be described below. A process of preparing the light emitting element-mounted carrier substrate includes the following steps.

1) Formation of Carrier Substrate with Resin Material Attached

A resin material 400 is continuously applied onto the carrier substrate 500 to obtain the carrier substrate 500 with the resin material 400 attached. The resin material 400 is, for example, at least one kind of resin material selected from the group consisting of a silicone-based resin, an epoxy-based resin, and an acrylic resin. The carrier substrate 500 can be made using a glass substrate or the like.

2) Attachment of Light Emitting Element Onto Carrier Substrate with Resin Material Attached The light emitting elements 300 are attached onto the carrier substrate 500 with the resin material 400 attached.

Specifically, at least two light emitting elements 300 are attached onto the single carrier substrate 500 with the resin material attached such that light emission surfaces 340 of the light emitting elements 300 contact the resin material 400 on the single carrier substrate 500.

As discussed above, a light emitting element-mounted carrier substrate 600 in which the light emitting elements 300 are mounted on the carrier substrate 500 can be produced. In FIG. 2E, three light emitting elements 300 are arranged in a row on the light emitting element-mounted carrier substrate 600, but three or more light emitting elements may be arranged. For example, 10000 to 30000 light emitting elements may be arranged in a matrix.

Figure 2H:
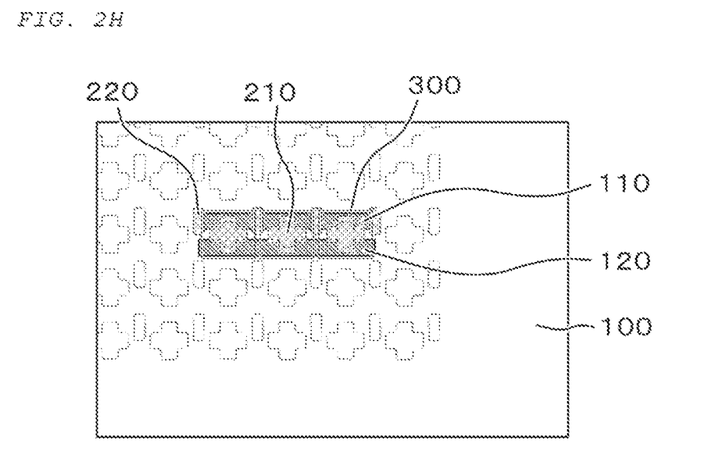
FIG. 2H is a plan view schematically showing an embodiment of peeling off the carrier substrate from the light emitting element.
Figure 2I:
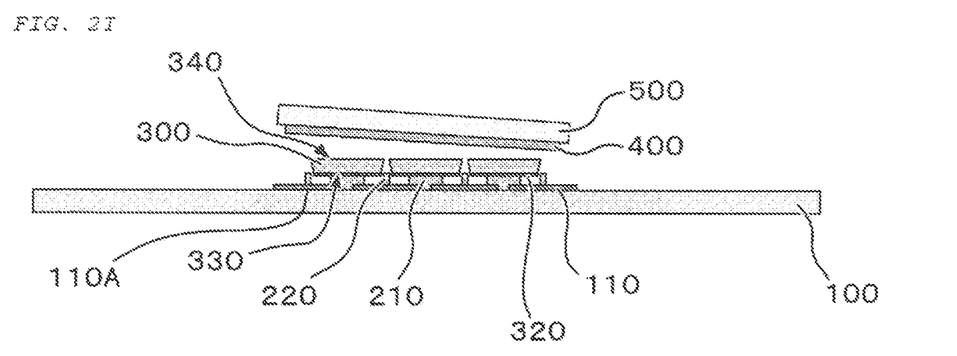
FIG. 2I is a cross-sectional view schematically showing the embodiment of peeling off the carrier substrate from the light emitting element.

After the light emitting element-mounted carrier substrate 600 is placed over the first resist patterns 210, the carrier substrate 500 is peeled off from the respective light emitting elements 300 as shown in FIGS. 2H and 2I. The peeling of the carrier substrate 500 may be performed after the joining step of the wiring seed layers with the light emitting elements, respectively by plating to be discussed below.

Figure 2J:
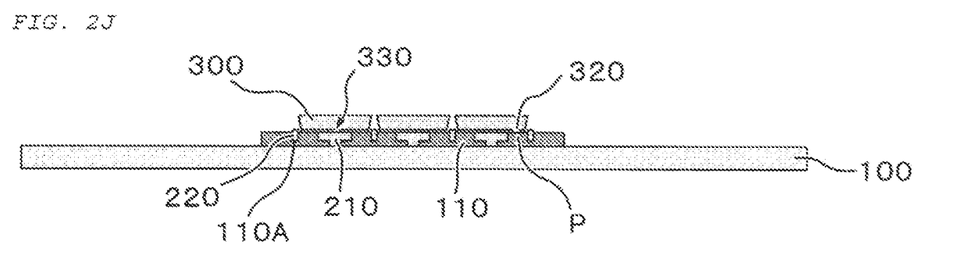
FIG. 2J is a cross-sectional view schematically showing an embodiment of joining the wiring seed layers with electrodes of the light emitting element, respectively by plating.

(D) Joining Step of Wiring Seed Layers with Electrodes of Light Emitting Element, Respectively by Plating FIG. 2J is a cross-sectional view schematically showing an embodiment of joining the wiring seed layers with electrodes of the light emitting element, respectively by plating.

As shown in FIG. 2J, by using the first resist patterns 210 and the second resist patterns 220 as the mask, the wiring seed layer 110 on the positive electrode side is joined by plating to the p-side electrode 310 disposed separately from the wiring seed layer 110 on the positive electrode side, while the wiring seed layer 120 on the negative electrode side is joined by plating to the n-side electrode 320 disposed separately from the wiring seed layer 120 on the negative electrode side.

Because the second resist pattern 220 also functions as the mask, the plating growth can be inhibited at the formation portion of the second resist pattern 220 in the wiring seed layer 110 during the plating process.

(E) Removal Step of Resist Patterns

Figure 2K:
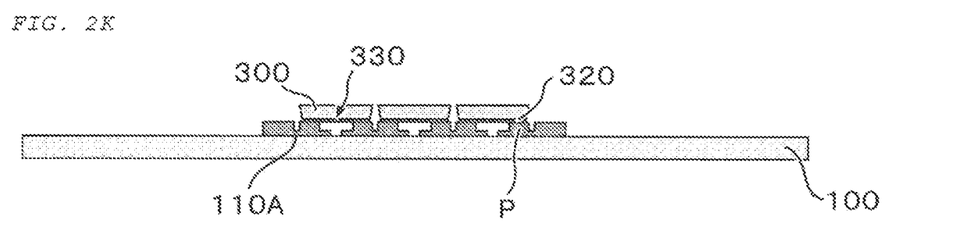
FIG. 2K is a cross-sectional view schematically showing an embodiment of removing the resist pattern.

FIG. 2K is a cross-sectional view schematically showing an embodiment of removing the resist patterns.

As shown in FIG. 2K, the first resist patterns 210 and the second resist patterns 220 are removed.

Figure 2L:
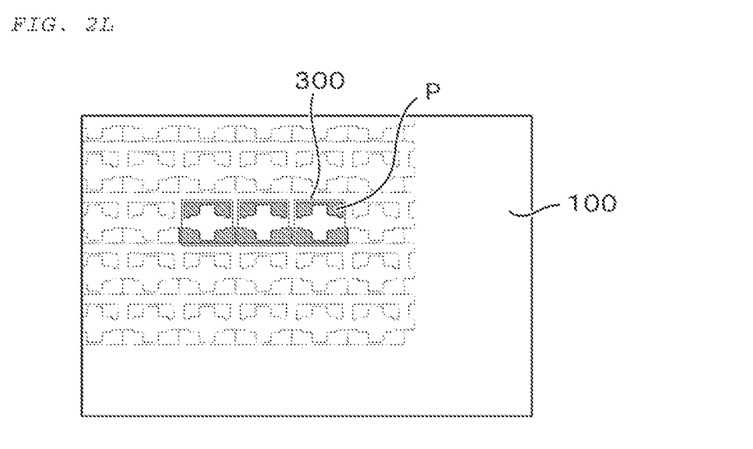
FIG. 2L is a plan view schematically showing an embodiment of cutting local parts of the wiring seed layer corresponding to removal portions of a second resist pattern.
Figure 2M:
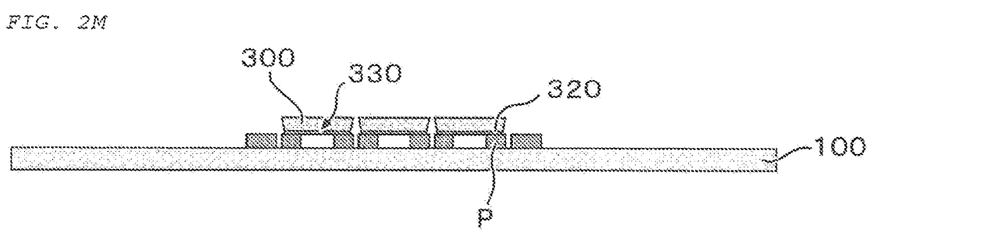
FIG. 2M is a cross-sectional view schematically showing the embodiment of cutting the local parts of the wiring seed layer corresponding to the removal portions of the second resist pattern.

FIG. 2L is a plan view schematically showing an embodiment of cutting local parts of the wiring seed layer corresponding to removal portions of the second resist pattern. FIG. 2M is a cross-sectional view schematically showing the embodiment of cutting the local parts of the wiring seed layer corresponding to the removal portions of the second resist pattern.

After the removal of the first resist patterns 210 and the second resist patterns 220, the local parts 110A of the wiring seed layer 110 corresponding to the removal portions of the second resist patterns 220 are cut as shown in FIGS. 2L and 2M. Thus, the wiring seed layer 110 can be cut at the local parts 110A into pieces that are electrically disconnected.

As a cutting method, for example, flash etching can be used. In the flash etching, the local parts 110A of the wiring seed layer can be removed by being immersed into an etching solution. As another method, an etching solution may be sprayed to remove the local parts 110A of the wiring seed layer 110.

The etching solution usable for the flash etching is at least one selected from the group consisting of hydrogen peroxide, sulfuric acid, ammonium persulfate, sodium persulfate, hydrochloric acid, nitric acid, ferric chloride, and copper chloride.

Figure 2N:
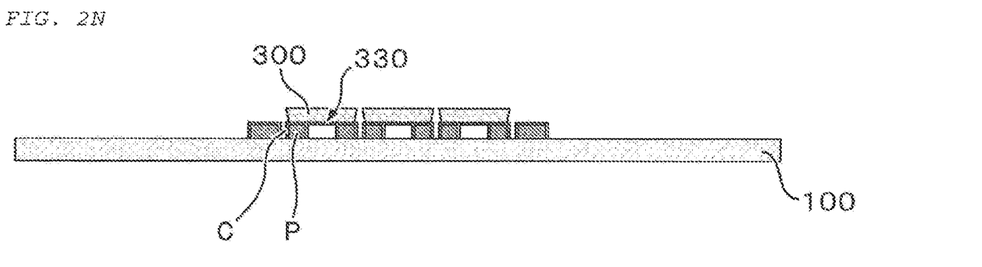
FIG. 2N is a cross-sectional view schematically showing an embodiment of applying an electroless plating process.

FIG. 2N is a cross-sectional view schematically showing an embodiment of applying an electroless plating process.

As shown in FIG. 2N, the local parts 110A of the wiring seed layer 110 may be cut, and then electroless plating process may be applied to the conductive member P to form a pad conductive member C. By applying such a plating process, the wiring seed layer (for example, Cu) is coated therewith not to be exposed, thereby making it possible to prevent corrosion of the wiring seed layer and also prevent wires from being peeled off from the wiring seed layer. Examples of a layer formed by the electroless plating process include stacked layers of Ni (nickel), Pd (palladium), and Au (gold) (the top surface being made of Au), or stacked layers of Au (gold), Pd (palladium), and Au (gold).

As discussed above, at least two light emitting elements 300 can be suitably mounted on the substrate 100. As a result, the light emitting device according to the second embodiment can be manufactured.

In a conventional method, by using a seed layer pattern formed on an upper surface of a transparent substrate as a mask, a back surface of the substrate is exposed to light, thereby curing an adhesive layer part, which serves as an adhesive layer pattern for holding a light emitting element during a plating process. That is, because the adhesive layer pattern must naturally be an inverted pattern of the seed layer pattern, the designs of the holding pattern of the light emitting element and the circuit pattern are inseparable, resulting in restrictions on the circuit pattern. For example, when electrical and mechanical connections with an island-shaped circuit part separated from its surroundings are intended to be established directly under the light emitting element, the wiring seed layer needs to be formed in an island shape in the conventional method, but this cannot cause current to flow therethrough, and thus plating growth by electrolytic plating does not take place, making it impossible to connect to the electrodes on the light emitting element side.

Furthermore, the island-shaped area is surrounded by the light emitting element, the substrate, and the adhesive layer, thus closing the flow path for the plating solution. Thus, even when employing the electroless plating process, the connection to the electrodes cannot be established. For this reason, any island-shaped light emitting element holding and wiring patterns cannot be formed directly under the light emitting element.

However, according to the manufacturing method of the second embodiment, a pattern shape of the wiring seed layer after the plating can also be defined by a resist in addition to the pattern of the wiring seed layer. Because of this, by a combination with subsequent etching (flash etching) or the like, the wiring seed layer with high flexibility in terms of pattern shape, like the island-shaped wiring seed layer, can be obtained.

In the second embodiment, the wiring seed layer 110 on the positive electrode side is cut, while the wiring seed layer 120 on the negative electrode side is not cut, so that the negative electrode sides of the respective light emitting elements form a common electrode, and the positive electrode sides of the respective light emitting elements become independent electrodes. Thus, the respective light emitting elements can be controlled to be lit independently. It is noted that in a case where the wiring seed layer 120 on the negative electrode side is cut, while the wiring seed layer 110 on the positive electrode side is not cut, the positive electrode sides of the respective light emitting elements form a common electrode, and the negative electrode sides of the respective light emitting elements become independent electrodes. Also in this case, the respective light emitting elements can be controlled to be lit independently.

In the above, the way of attaching the "single" light emitting element-mounted carrier substrate 600 onto at least two first resist patterns 210 that are formed with a predetermined spacing therebetween has been explained. However, the attachment is not limited thereto. For example, "at least two" light emitting element-mounted carrier substrates 600 may be attached with a predetermined spacing therebetween onto the at least two first resist patterns 210. In this case, the first resist pattern 210 can be shaped to extend in the same direction as the extending direction of the wiring seed layer in the plan view.

[Light Emitting Device]

Figure 3:
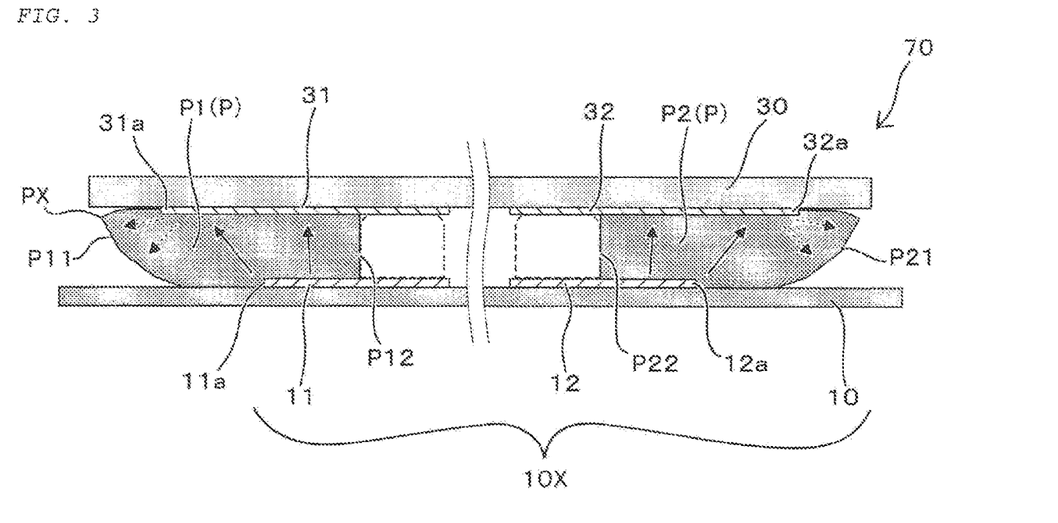
FIG. 3 is a cross-sectional view schematically showing a configuration of a light emitting device according to an embodiment of the present invention.
Figure 4:
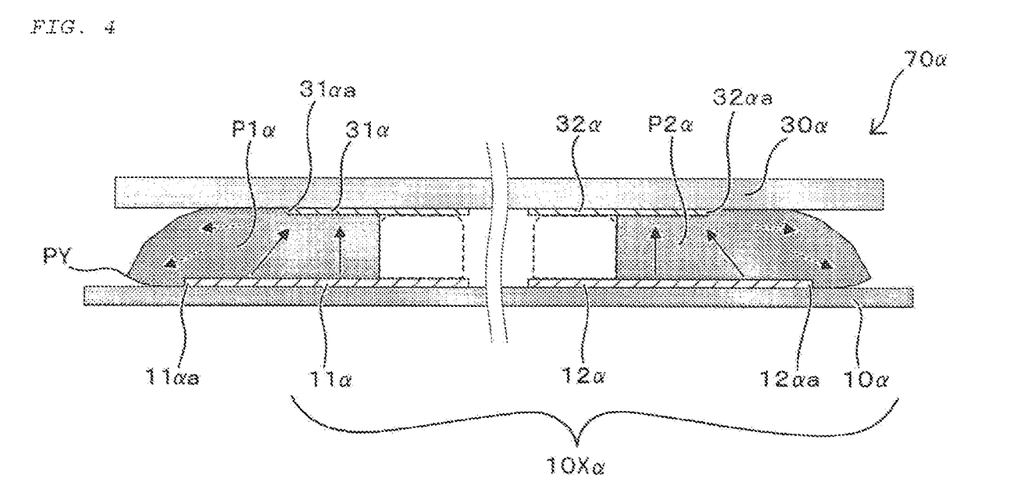
FIG. 4 is a cross-sectional view schematically showing a configuration of a light emitting device according to another embodiment of the present invention.

The light emitting devices obtained by the manufacturing methods of the first embodiment and second embodiment discussed above can have the following configuration. FIG. 3 is a cross-sectional view schematically showing the configuration of the light emitting device according to an embodiment of the present invention. FIG. 4 is a cross-sectional view schematically showing the configuration of a light emitting device according to another embodiment of the present invention. As shown in FIG. 3, a light emitting device 70 according to the embodiment of the present invention includes: a wiring substrate 10X including the substrate 10 and a wiring 11 on a positive electrode side, which can be referred to as a first wiring and a wiring 12 on a negative electrode side, which can be referred to as a second wiring, these wirings being disposed on the substrate 10; a light emitting element 30 located over the wiring substrate 10X and including a p-side electrode 31 corresponding to a first electrode and an n-side electrode 32 corresponding to a second electrode; a first conductive member P1 connecting the wiring 11 on the positive electrode side and the p-side electrode 31; and a second conductive member P2 connecting the wiring 12 on the negative electrode side and the n-side electrode 32.

In such a configuration of the one embodiment of the present invention, an outer lateral surface P11 or P21 of at least one of the first conductive member P1 and the second conductive member P2 is configured to protrude outward from a straight line that connects an outer end 11a or 12a of the wiring and an outer end 31a or 32a of the electrode in the cross-sectional view. It is noted that the "cross-sectional view" as used herein refers to the view from the direction of taking out the p-side electrode 31, the n-side electrode 32, as well as the wiring 11 on the positive electrode side and the wiring 12 on the negative electrode side, which are disposed to face these electrodes.

In a conductive member formation stage during the manufacturing of the above light emitting device, the conductive member is formed by causing one lateral surface thereof to grow following the lateral surface of the resist, and also causing the other lateral surface thereof to grow in a free space between the light emitting element 30 and the wiring substrate 10X, from the wiring seed layer toward the electrode. The shape of the inner lateral surfaces P12 and P22 of the first conductive member P1 and the second conductive member P2 can depend on the lateral surface shape of the resist pattern formed on the substrate in the conductive member formation stage discussed above. As discussed above, in a case where the cross-sectional shape of the resist pattern is a rectangle or a square, the lateral surface of the resist pattern is orthogonal to the upper surface of the wiring. Along with this, the shape of the inner lateral surfaces P12 and P22 of the first conductive member P1 and the second conductive member P2 can also be orthogonal to the upper surface of the wiring (corresponding to the wiring seed layer during the manufacture) upon completion of the manufacture. The "orthogonal" as used herein refers to the state in which an angle between the inner lateral surface of the conductive member and the upper surface of the wiring is 90 degrees or 90 degrees±5 degrees in the cross-sectional view. The inner lateral surfaces of the first conductive member P1 and the second conductive member P2 are not limited to being orthogonal to the upper surface of the wiring. The inner lateral surface of at least one of the first conductive member P1 and the second conductive member P2 may be orthogonal to the upper surface of the wiring.

Meanwhile, the shape of the outer lateral surfaces P11 and P21 of the first conductive member P1 and the second conductive member P2 that are finally obtained does not depend on the lateral surface shape of the resist pattern. For such a reason, the outer lateral surfaces P11 and P21 of the conductive member finally obtained protrude outward from a straight line connecting the ends 11a and 12a of the wirings and the ends 31a and 32a of the electrodes of the light emitting element 30. By causing the outer lateral surface of the conductive member to protrude, the contact area between the conductive member and the light emitting element increases, thus enabling the improvement in the heat dissipation property. Furthermore, as discussed above, because the inner lateral surface of the conductive member is the side where the conductive member grows along the lateral surface of the resist pattern disposed during the manufacture, the first conductive member P1 and the second conductive member P2 that are finally obtained can be brought into a state of being disposed with a certain interval therebetween after the removal of the resist pattern. Therefore, the occurrence of short-circuit due to contact between the first conductive member P1 and the second conductive member P2 can be suitably avoided. As can be seen from the above, the light emitting device 70 according to the embodiment of the present invention can both improve the heat dissipation property and suppress the occurrence of short-circuit.

In the cross-sectional view, the position of a protruding end of the conductive member can also vary depending on the positional relationship between the end 31a or 32a of the electrode and the end 11a or 12a of the wiring. Specifically, as shown in FIG. 3, when the end 31a or 32a of the electrode is located outside the end 11a or 12a of the wiring in the cross-sectional view, a configuration in which the protruding end PX of the conductive member P is located on the electrode 31 or 32 side can be adopted. In contrast, as shown in FIG. 4, when the end 11αa or 12αa of the wiring is located outside the end 31αa or 32αa of the electrode in the cross-sectional view, a configuration in which the protruding end PY of the conductive member is located on the substrate 10α side can be adopted.

Further, as discussed above in the paragraph of the manufacturing method of the present invention, the conductive member can be formed by exposure to light via the substrate without forming the adhesive layer pattern. Therefore, not only a transparent substrate, but also a non-transparent substrate can be used as the substrate. Consequently, the number of types of usable substrates can be increased.

The light emitting elements used in the first embodiment and the second embodiment include a semiconductor laminate and the electrodes. The light emitting element has a light emitting surface (also called a main light emitting surface), lateral surfaces extending in different directions with respect to the light emitting surface, and an electrode surface opposite to the light emitting surface and provided with one pair of positive and negative electrodes.

As a light emitting element, a semiconductor light emitting element capable of emitting light with any wavelength can be selected. For example, a light emitting diode or the like can be selected as the light emitting element. By way of example, as the light emitting element, one that emits blue light can be used. The light emitting element is not limited thereto and may be one that emits light of any color other than blue light. When using a plurality of respective light emitting elements disposed with the predetermined spacing therebetween in the light emitting device, they may emit light of the same color or may emit light of different colors.

For example, a nitride-based semiconductor ($In_xAl_yGa_{1-x-y}N$, $0 \leq X$, $0 \leq Y$, $X+Y \leq 1$) can be used as the semiconductor laminate of a light emitting element capable of emitting blue light. In this case, the nitride-based semiconductor light emitting element has, for example, a sapphire substrate and a nitride-based semiconductor laminated structure laminated on the sapphire substrate. The nitride-based semiconductor laminated structure includes a light emitting layer, and an n-type nitride-based semiconductor layer and a p-type nitride-based semiconductor layer that are located to sandwich the light emitting layer therebetween. Electrodes, namely, an n-side electrode and a p-side electrode, are electrically connected to the n-type nitride-based semiconductor layer and the p-type nitride-based semiconductor layer, respectively.

The light emitting element may have any shape in the plan view, such as a square and a rectangle. Further, it may have a polygonal shape, such as a triangle and a hexagon. The size of the light emitting element 30 in the plan view can have the vertical and horizontal dimensions of, for example, between 10 μm and 100 μm, and preferably between 20 μm and 80 μm, inclusive, in the plan view. The height of the light emitting element 30 can be between 1 μm and 50 μm, and preferably between 2 μm and 10 μm, inclusive.

In both the first embodiment and the second embodiment, the following embodiment is preferably adopted.

From the viewpoint of easily guiding light emitted from the light emitting element in a predetermined direction after disposing the light emitting element above the substrate, a light reflective member is preferably provided to enclose the lateral surfaces of the light emitting element. When a plurality of light emitting elements are arranged adjacent to each other, they may be provided in such a manner as to fill a gap between adjacent light emitting elements. The light reflective member can be formed using, for example, white resin in which white powder or the like that reflects light is added to the transparent resin. The light reflective member may be made of, for example, a silicone resin containing inorganic white powder such as titanium oxide. From the viewpoint of suitably reflecting the light emitted from the light emitting element, the light reflective member may be made of a white resin having a reflectance of, for example, 60% or more to this light, and preferably a white resin having a reflectance of 90% or more. In a method of forming the light reflective member on the lateral surface of the light emitting element, resist is provided on the upper surface of the light emitting element, white resin is applied to the upper surface of the light emitting element and the gap between adjacent light emitting elements, and then the resist disposed on the upper surface of the light emitting element is removed, so that the white resin remaining on the lateral surfaces of the light emitting element becomes the light reflective member.

A light-transmissive member may also be provided between the lateral surface of the light emitting element and the light reflective member and/or on the light emitting surface of the light emitting element. Examples of the material of the light-transmissive member include a silicone-based resin, an epoxy-based resin, and an acrylic resin.

A wavelength conversion member capable of absorbing light emitted from the light emitting element at its light emitting surface side and converting it into light with a different wavelength may be provided. The wavelength conversion member contains a wavelength conversion material such as a phosphor and the like. Examples of the phosphor include YAG phosphors (($Y,Lu,Gd)_3(Al,Ga)_5O_{12}$:Ce) that emit yellow-based light, β-SiAlON phosphors that emit green-based light, fluoride-based phosphors (for example, $K_2(Si,Ti,Ge)F_6$:Mn) that emit red-based light, nitride-based phosphors (for example, $(Sr,Ca)AlSiN_3$:Eu), and the like. The wavelength conversion member may contain a single kind of wavelength conversion material or may contain a plurality of kinds of wavelength conversion materials.

While the embodiments of the present invention have been described above, these embodiment are illustrative only and interpreted as typical examples that fall within the range of applications of the present invention. Therefore, it will be readily understood by those skilled in the art that the present invention is not limited thereto and that various modifications may be made.

The light emitting device according to the present embodiment is suitable for use in automobile headlights, projectors, and the like.

DESCRIPTION OF REFERENCE CHARACTERS

10 Substrate
10X, 10Xα Wiring substrate
11 Wiring seed layer on a positive electrode side
11a, 11αa Wiring end on the positive electrode side
12 Wiring seed layer on a negative electrode side
12a, 12αa Wiring end on the negative electrode side
20 Resist pattern
30, 30α Light emitting element
31, 31α P-side electrode of the light emitting element
31a, 31αa End of the P-side electrode
32, 32α N-side electrode of the light emitting element
32a, 32αa End of the n-side electrode
33 Electrode surface of the light emitting element
70, 70α Light emitting device
100 Substrate
110 Wiring seed layer on a positive electrode side
120 Wiring seed layer on a negative electrode side
210 First resist pattern
220 Second resist pattern
300 Light emitting element
310 P-side electrode of the light emitting element
320 N-side electrode of the light emitting element
330 Electrode surface of the light emitting element
340 Light emitting surface of the light emitting element
400 Resin material
500 Carrier substrate
600 Light emitting element-mounted carrier substrate
P Conductive member
P1, P1α First conductive member
P11 Outer lateral surface of the first conductive member
P12 Inner lateral surface of the first conductive member
P2, P2α Second conductive member
P21 Outer lateral surface of the second conductive member
P22 Inner lateral surface of the second conductive member
PX, PY Protruding end of the conductive member
C Pad conductive member

The invention claimed is:

1. A method of manufacturing a light emitting device, the method comprising:
providing a light emitting element comprising a p-side electrode and a n-side electrode on a same surface side;
providing a substrate on which a first wiring seed layer and a second wiring seed layer are formed with a predetermined spacing therebetween;
forming a resist pattern, at least a part of which is within an area on the substrate where the light emitting element is to be placed;
subsequently, placing the light emitting element on the resist pattern such that the p-side electrode and the first wiring seed layer are separated from and face each other, and the n-side electrode and the second wiring seed layer are separated from and face each other;
subsequently, joining the first wiring seed layer with the p-side electrode disposed separately from the first wiring seed layer, and joining the second wiring seed layer with the n-side electrode disposed separately from the second wiring seed layer, by plating using the resist pattern as a mask; and
subsequently, removing the resist pattern.

2. The method according to claim 1, wherein a planar size of the resist pattern is smaller than a planar size of the light emitting element.

3. The method according to claim 1, wherein the resist pattern has an adhesive property, such that, in the step of placing the light emitting element on the resist pattern, the light emitting element is bonded to the resist pattern.

4. The method according to claim 1, wherein the substrate is non-transparent.

5. The method according to claim 1, wherein:
in the step of providing the light emitting element, at least two light emitting elements are provided, wherein
in the step of providing the substrate on which the first wiring seed layer and the second wiring seed layer are formed, the first wiring seed layer and the second wiring seed layer extend substantially in a same direction, and
in the step of forming the resist pattern, at least two resist patterns are formed, at least a part of each of which is within a respective area on the substrate where a respective one of the light emitting elements are to be placed with a predetermined spacing, and
in the step of placing the light emitting element, each light emitting element is placed on a respective resist pattern.

6. The method according to claim 5, further comprising forming a second resist pattern in a portion between a first light emitting element and a second light emitting element that are adjacent to each other, and on the first wiring seed layer or the second wiring seed layer.

7. The method according to claim 6, wherein the second resist pattern is formed continuously from one end to another end in a direction perpendicular to an extending direction of the first wiring seed layer or the second wiring seed layer.

8. The method according to claim 7, further comprising, after removing the resist pattern and the second resist pattern, cutting the wiring seed layer at the removal portion of the second resist pattern.

9. The method according to claim 5, wherein:
the step of providing a light emitting element comprises, before placing the light emitting element on the resist pattern, preparing a light emitting element-mounted carrier substrate by providing the light emitting element on a carrier substrate such that a light emitting surface of the light emitting element and the carrier substrate face each other;
the step of placing the light emitting element on the resist pattern comprises:
placing the light emitting element-mounted carrier substrate on the resist pattern such that an electrode surface of the light emitting element of the light emitting element-mounted carrier substrate and the resist pattern face each other, and
subsequently, peeling the carrier substrate from the light emitting element.

10. The method according to claim 1, wherein:
at least one of the first wiring seed layer and the second wiring seed layer includes a concave portion in a plan view, and
in the step of forming the resist pattern, the resist pattern is formed to be inserted into the concave portion.

11. The method according to claim 1, wherein, in a cross-sectional view, a height of the resist pattern where the light emitting element is to be placed is greater than a height of each of the first wiring seed layer and the second wiring seed layer.

12. The method according to claim 1, wherein the step of providing the substrate on which the first wiring seed layer and the second wiring seed layer are formed comprises forming the first wiring seed layer and the second wiring seed layer on the substrate.

\* \* \* \* \*